United States Patent
Stamper et al.

(10) Patent No.: US 10,469,041 B2
(45) Date of Patent: Nov. 5, 2019

(54) GALLIUM NITRIDE (GAN) POWER AMPLIFIERS (PA) WITH ANGLED ELECTRODES AND 100 CMOS AND METHOD FOR PRODUCING THE SAME

(71) Applicant: GLOBALFOUNDRIES Inc., Grand Cayman (KY)

(72) Inventors: Anthony Kendall Stamper, Burlington, VT (US); Vibhor Jain, Essex Junction, VT (US); Humberto Campanella Pineda, Singapore (SG); John Joseph Pekarik, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 208 days.

(21) Appl. No.: 15/886,475

(22) Filed: Feb. 1, 2018

(65) Prior Publication Data
US 2019/0238105 A1    Aug. 1, 2019

(51) Int. Cl.
*H01L 27/06*      (2006.01)
*H03F 3/21*      (2006.01)
(Continued)

(52) U.S. Cl.
CPC ........... *H03F 3/21* (2013.01); *H01L 21/0245* (2013.01); *H01L 21/02178* (2013.01);
(Continued)

(58) Field of Classification Search
None
See application file for complete search history.

(56) References Cited

U.S. PATENT DOCUMENTS

| | | |
|---|---|---|
| 7,968,913 B2 | 6/2011 | Hopper et al. |
| 8,487,316 B2 | 7/2013 | Cheng et al. |

(Continued)

OTHER PUBLICATIONS

Zhuang et al., "Wet etching of GaN, AlN, and SiC: a review", Published by Elsevier Science B. V. , in Materials Science and Engineering vol. 48, Issue 1, available online Jan. 20, 2005, retrieved on Feb. 7, 2018 from "https://www.sciencedirect.com/", pp. 1-46.

(Continued)

*Primary Examiner* — Ali Naraghi
(74) *Attorney, Agent, or Firm* — Ditthavong & Steiner P. C.

(57) ABSTRACT

A method of forming a CMOS device and a GaN PA structure on a 100 Si substrate having a surface orientated in 111 direction and the resulting device are provided. Embodiments include forming a device with a protective layer over a portion of a Si substrate; forming a V-shaped groove in the Si substrate; forming a buffer layer, a GaN layer, an AlGaN layer and a passivation layer sequentially over the Si substrate; forming trenches through the passivation and the AlGaN layers; forming second trenches through the passivation layer; forming electrode structures over portions of the passivation layer and filling the first and second trenches; removing portions of the passivation layer, the AlGaN layer and the GaN layer outside of the V-shaped groove down to the buffer layer; forming a dielectric layer over the Si substrate; and forming vias through the dielectric layer down to electrode structures and the device.

10 Claims, 19 Drawing Sheets

(51) Int. Cl.
*H01L 21/304* (2006.01)
*H01L 21/8238* (2006.01)
*H01L 27/02* (2006.01)
*H01L 21/762* (2006.01)
*H01L 21/02* (2006.01)

(52) U.S. Cl.
CPC .... *H01L 21/02304* (2013.01); *H01L 21/3043* (2013.01); *H01L 21/762* (2013.01); *H01L 21/8238* (2013.01); *H01L 27/02* (2013.01)

(56) References Cited

U.S. PATENT DOCUMENTS

| | | |
|---|---|---|
| 9,059,075 B2 | 6/2015 | Bayram et al. |
| 2015/0079738 A1* | 3/2015 | Barlow ............... H01L 29/1029 438/172 |
| 2016/0365341 A1* | 12/2016 | Then ................... H01L 27/0629 |

OTHER PUBLICATIONS

Khan et al., "High rate etching of AlN using BCl3/ CL2 Ar inductively coupled plasma", Published by Elsevier Science B. V. in Materials Science and Engineering B95 (2002), pp. 51-54.

Zhuang et al., English Abstract of "Wet etching of GaN, AlN, and SiC: a review", Published by Elsevier Science B. V., in Materials Science and Engineering vol. 48, Issue 1, Jan. 17, 2005, 3 pages.

\* cited by examiner

US 10,469,041 B2

GALLIUM NITRIDE (GAN) POWER AMPLIFIERS (PA) WITH ANGLED ELECTRODES AND 100 CMOS AND METHOD FOR PRODUCING THE SAME

TECHNICAL FIELD

The present disclosure relates to methods of manufacturing complimentary metal-oxide-semiconductor (CMOS) devices. The present disclosure is particularly applicable to fabricating gallium nitride (GaN) power amplifiers (PA) structures and CMOS devices on a 100 silicon (Si) substrate.

BACKGROUND

The use of GaN as a channel material in the fabrication of CMOS devices has been found to provide CMOS devices with a lower drain-source resistance (Rdson) because GaN provides improved carrier mobility and has a wider band gap. However, one of the problems with using GaN is the limited availability of suitable substrates for epitaxial growth. For example, a defect free and useful epitaxial deposition of GaN is achievable only on a 111 Si substrate, while CMOS is typically processed on a 100 Si substrate. Since CMOS cannot be integrated onto a 111 Si substrate due to defect issues, this places practical constraints on using GaN in conjunction with CMOS on a 100 Si substrate.

A need therefore exists for methodology enabling fabrication of a CMOS device and a GaN PA structure on a 100 Si substrate having a 111 surface orientation.

SUMMARY

An aspect of the present disclosure is a method for forming a CMOS device and a GaN PA structure on a 100 Si substrate having a surface oriented in 111 direction.

Another aspect of the present disclosure is a CMOS device on a 100 Si substrate having a GaN PA structure therein on a 111 oriented surface.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a Si substrate with a device over a portion of the Si substrate and a protective layer over the device and a portion of the Si substrate; forming a V-shaped groove in a portion of the Si substrate; forming a buffer layer, a GaN layer, an aluminum gallium nitride (AlGaN) layer and a passivation layer sequentially over the Si substrate; forming first trenches through the passivation layer and the AlGaN layer on one or both sides of the V-shaped groove; forming second trenches through the passivation layer on the one or both sides; forming electrode structures over portions of the passivation layer and filling the first trenches and the second trenches; removing portions of the passivation layer, the AlGaN layer and the GaN layer outside of the V-shaped groove down to the buffer layer; forming a dielectric layer over the Si substrate; and forming a via through the dielectric layer down to at least one of the electrode structure and the device.

Aspects of the present disclosure include forming the V-shaped groove by: forming a photo resist or a dielectric layer over the Si substrate; forming a trench through the photo resist or the dielectric layer down to the Si substrate; and performing a wet etch such that each side of the V-shaped groove is at 54.7 degrees. Further aspects include forming the first trenches by: forming a conformal resist layer over the passivation layer; patterning the conformal resist layer down to the passivation layer; and etching the passivation layer and the AlGaN layer through the patterned conformal resist layer down to the GaN layer. Another aspect includes forming the second trenches by: removing the conformal resist layer; forming a second conformal resist layer over the passivation layer, filling the first trenches; patterning the second conformal resist layer down to the passivation layer; and etching the passivation layer through the patterned second conformal resist layer down to the AlGaN layer. Additional aspects include etching the portions of the passivation layer and the AlGaN layer down to the GaN layer and etching the portions of the passivation layer down to the GaN layer, respectively, by: wet etching or a plasma etching with boron trichloride ($BCL_3$)/chlorine ($CL_2$) gases. Further aspects include forming the electrode structures by: removing the second conformal resist layer; forming an electrode layer over the passivation layer, filling the first trenches and the second trenches; and etching portions of the electrode layer down to the passivation layer. Additional aspects include removing portions of the passivation layer, the AlGaN layer and the GaN layer down to the buffer layer by: forming a conformal resist layer over the passivation layer and the electrode structures; patterning the conformal resist layer over the Si substrate outside of the V-shaped groove down to the passivation layer; and etching the passivation layer, the AlGaN layer and the GaN layer through the patterned conformal resist layer down to the buffer layer. Further aspects include etching the passivation layer, the AlGaN layer, the GaN layer and the buffer layer through the patterned conformal resist layer down to the Si substrate. Additional aspects include forming an isolation structure in a middle of the V-shaped groove down to the buffer layer or to the Si substrate prior to forming the dielectric layer by: patterning the conformal resist layer over the middle of the V-shaped groove down to the passivation layer; and etching the passivation layer, the AlGaN layer and the GaN layer down to the buffer layer or etching the passivation layer, the AlGaN layer, the GaN layer and the buffer layer down to the Si substrate.

Another aspect of the present disclosure is a device including: a CMOS transistor on a 100 Si; and a GaN high electron mobility transistor (HEMT) on a 111 Si, wherein the 100 Si and the 111 Si are contiguous.

Aspects of the device include the GaN HEMT including: a buffer layer over a portion of each surface of a V-shaped groove; a GaN layer over the buffer layer; an AlGaN layer over the GaN layer; a passivation layer over the AlGaN layer; a first electrode over a portion of the passivation layer and through the passivation layer and the AlGaN layer down to the GaN layer; a second electrode over a portion of the passivation layer and through the passivation layer down to the AlGaN layer; a dielectric layer over the 111 Si; and a metal-filled via through the dielectric layer down to at least one of the first electrode and the second electrode. Another aspect includes a protective layer over the CMOS transistor and on portions of the 100 Si; a dielectric layer over the 100 Si and the protective layer; and a metal-filled via through the dielectric layer and the protective layer to the CMOS transistor. Other aspects include the buffer layer, the GaN layer, the AlGaN layer, and the passivation layer each having vertical ends. A further aspect includes each sidewall of the V-shaped groove having an angle of approximately 54.7 degrees, and wherein each of the first electrode and the second electrode is formed at the angle of approximately 54.7 degrees. Additional aspects include each first electrode and second electrode formed on one sidewall of the V-shaped groove or both. Another aspect includes a second buffer layer over a remaining portion of the V-shaped groove. Other aspects include a second GaN layer over the second buffer layer; a second AlGaN layer over the second GaN layer; and a second passivation layer over the second AlGaN layer.

A further aspect of the present disclosure is a device including: a first Si layer; a silicon germanium (SiGe) layer over the first Si layer; a second Si layer over the SiGe layer with a trench down to the SiGe layer having angled sidewalls; a buffer layer over a portion of each angled sidewall of the trench; a GaN layer over the buffer layer; an AlGaN layer over a portion of the GaN layer; a passivation layer over the AlGaN layer; a first electrode structure through the passivation layer and the AlGaN layer down to the GaN layer; a second electrode structure through the passivation layer down to the AlGaN layer; a third electrode structure through the passivation layer and the AlGaN layer down to the GaN layer and over a portion of one of the angled sidewall and the SiGe layer within the trench; a dielectric layer over the first Si layer, filling the trench; a device over a portion of the second Si layer proximate to the trench; and a metal-filled via through the dielectric layer down to each of the first electrode structure, the second electrode structure and the third electrode structure.

Aspects of the present disclosure include a second device formed over the SiGe layer within the trench; and a second metal-filled via through the dielectric layer down to the second device. Another aspect includes each angled sidewall including 111 Si and having an angle of approximately 54.7 degrees and wherein the first Si layer and a remaining portion of the second Si layer includes 100 Si.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of constraints on using GaN as a channel material attendant upon forming CMOS devices. The problem is solved, inter alia, by forming a CMOS device and a GaN HEMT for PA applications on a 100 Si substrate having a surface oriented in 111 direction.

Methodology in accordance with embodiments of the present disclosure includes providing a Si substrate with a device over a portion of the Si substrate and a protective layer over the device and a portion of the Si substrate. A V-shaped groove is formed in a portion of the Si substrate. A buffer layer, a GaN layer, an AlGaN layer and a passivation layer are sequentially formed over the Si substrate. First trenches are formed through the passivation layer and the AlGaN layer on one or both sides of the V-shaped groove. Second trenches are formed through the passivation layer on the one or both sides. Electrode structures are formed over portions of the passivation layer and filling the first trenches and the second trenches. Portions of the passivation layer, the AlGaN layer and the GaN layer outside of the V-shaped groove are removed down to the buffer layer. A dielectric layer is formed over the Si substrate, and a via is formed through the dielectric layer down to at least one of the electrode structure and the device.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
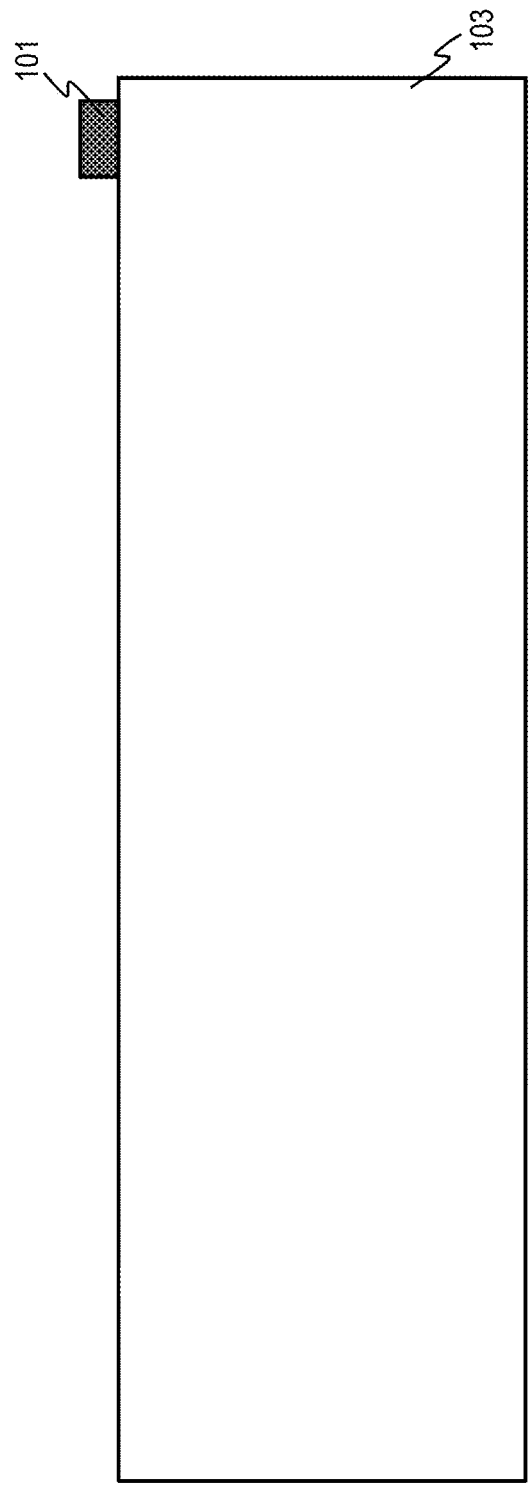
FIGS. 1 through 18 schematically illustrates cross-sectional views of a process flow for forming a CMOS device and a GaN PA structure on a 100 Si substrate having a 111 surface orientation, in accordance with an exemplary embodiment.
Figure 2:
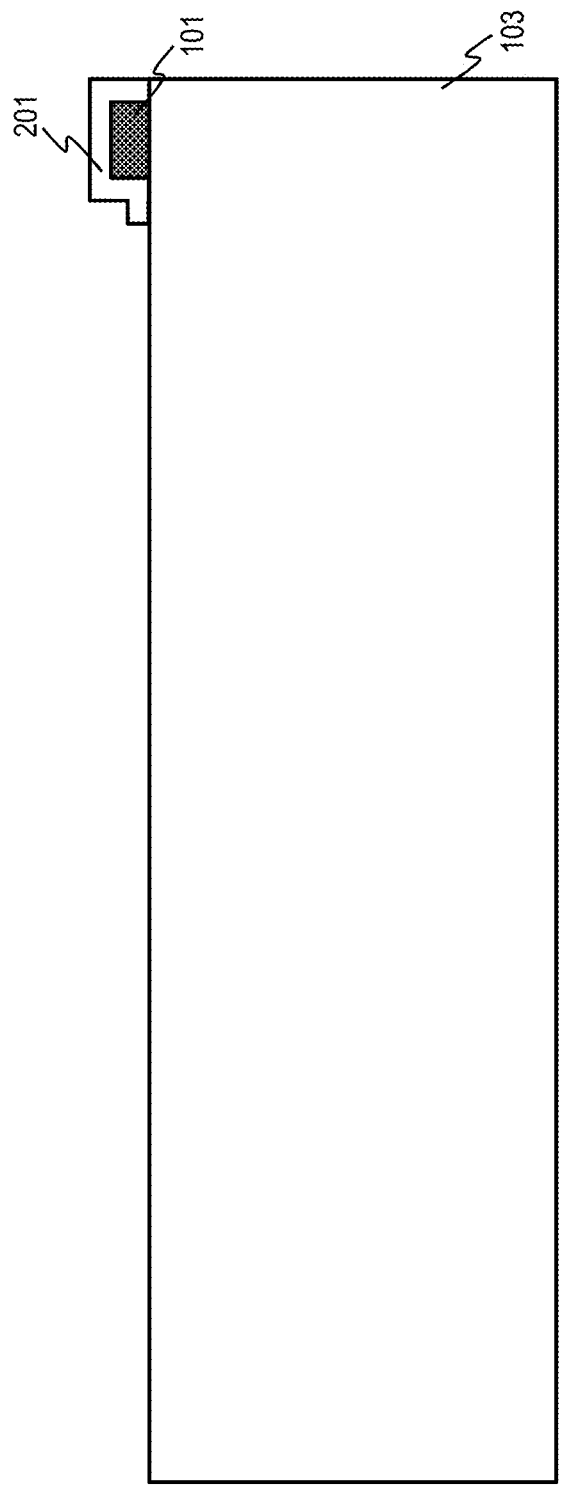

FIGS. 1 through 18 schematically illustrates cross-sectional views of a process flow for forming a CMOS device and a GaN PA structure on a 100 Si substrate having a 111 surface orientation, in accordance with an exemplary embodiment. Referring to FIG. 1, a device 101 is formed over a portion of a Si substrate 103 including a 100 Si orientation. In one instance, the device 101 may include a field effect transistor (FET), a bipolar junction (NPN or PNP) transistor, a hetero-junction bipolar transistor (HBT), a metal oxide semiconductors (MOS) capacitor, a deep trench capacitor, a flash memory cell, a magnetic memory cell, a pn junction solar cell, a poly resistor, a diffusion resistor or a diode. It should be understood that the drawing of the device 101 is only for illustrative purposes and does not include all of the specific elements of the device. In another instance, various structures may be formed, e.g., a shallow trench isolation (STI) or an implant, in the Si substrate 103. Next, a protective layer (not shown for illustrative convenience) is formed, e.g., of silicon nitride (SiN), silicon oxide (oxide), etc., over the Si substrate 103 and the device 101 and then, the protective layer is patterned and etched, forming a protective layer 201 over the device 101 and a portion of the Si substrate 103, as depicted in FIG.

2. The composition of the protective layer 201 is chosen to protect the device 101 during the subsequent GaN processing. The Protective layer 201 may be removed using the subsequent patterning steps implemented in FIG. 3.

Figure 3:
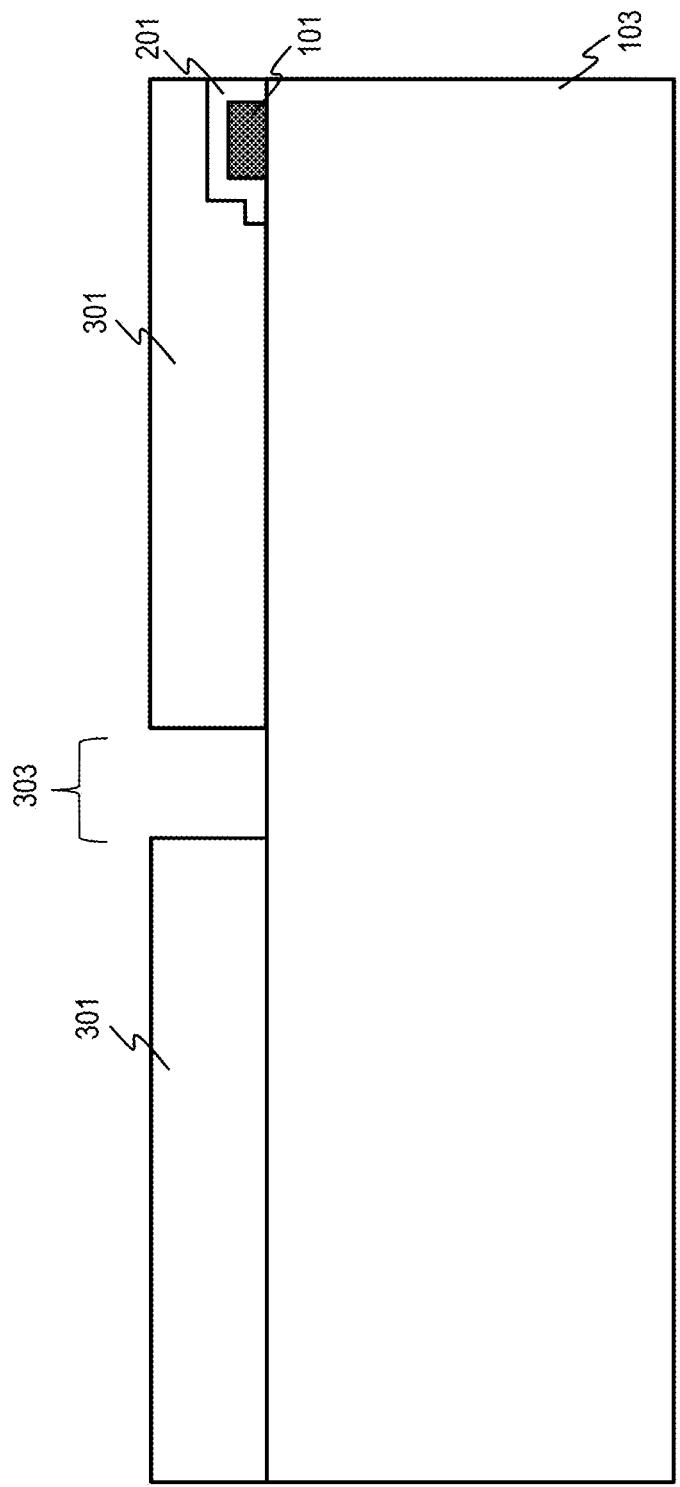
Figure 4:
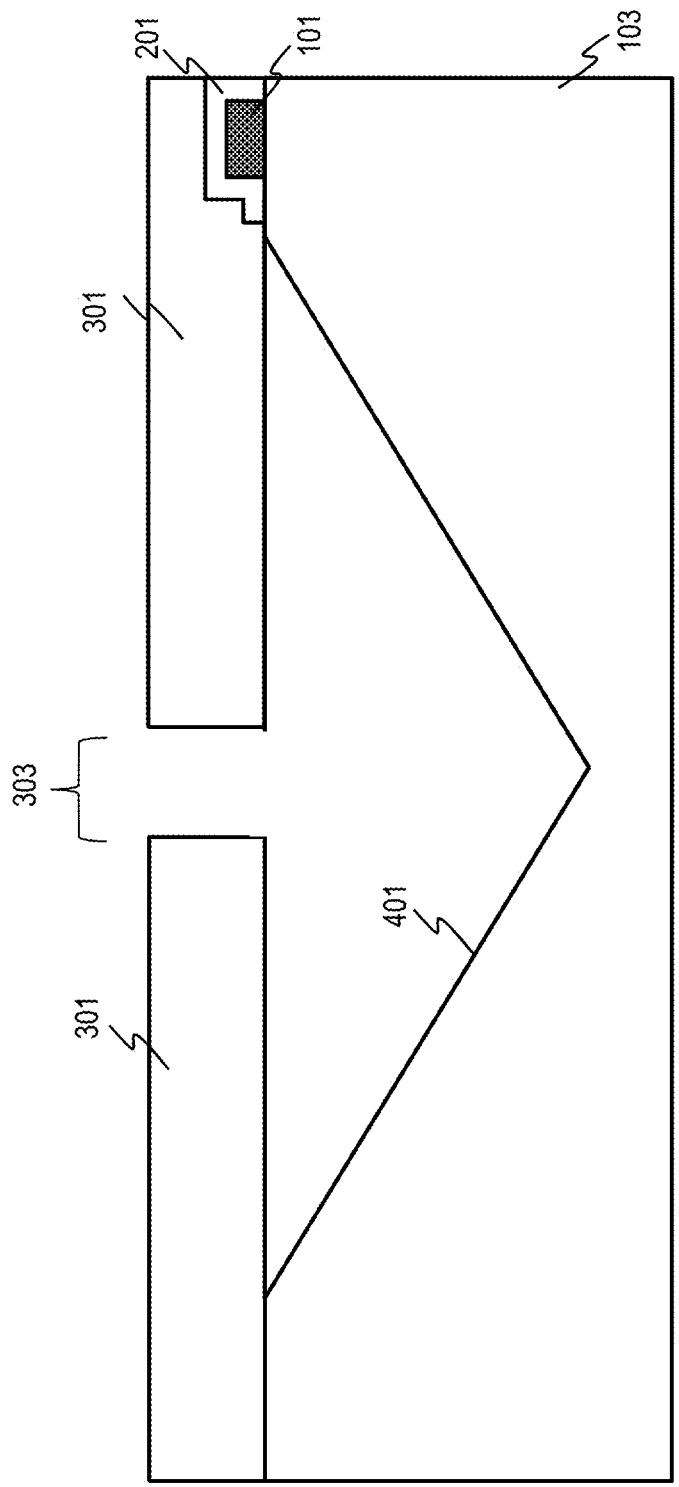

Referring to FIG. 3, a photoresist 301 is formed over the Si substrate 103 and the protective layer 201. Then, the photoresist 301 is exposed and developed in the center portion down to the Si substrate 103, forming an opening 303. Subsequently, the Si substrate 103 is etched through the opening 303, e.g., by a wet etch including potassium hydroxide (KOH) or similar wet etchants, to form a V-shaped groove 401, as illustrated in FIG. 4. Specifically, each side of the V-shaped groove 401 is formed at approximately 54.7 degrees, thus having a 111 angled Si surface.

Figure 5:
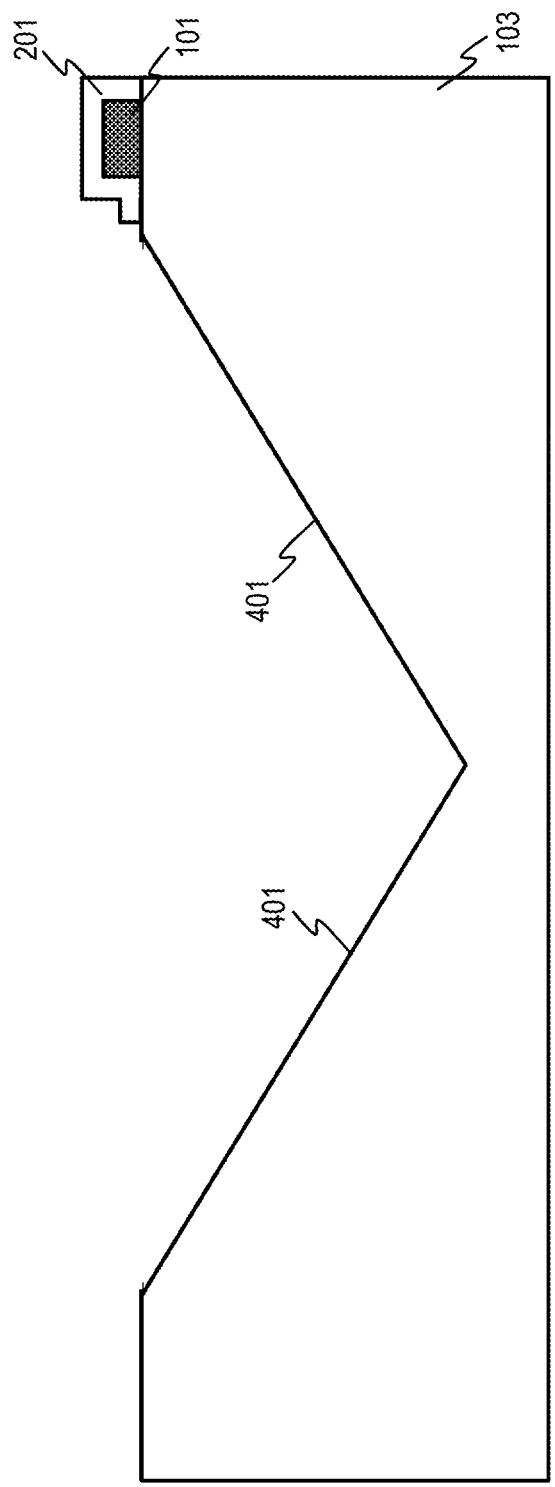

Next, the photoresist 301 is removed, as depicted in FIG. 5. Alternatively, as described above, the protective layer 201 could be under the opening 303 and may be removed by etching prior to forming the V-shaped groove 401 in the Si substrate 103. In one instance, the photoresist 301 may be stripped prior to or after formation of the V-shaped groove 401 and the protective layer 201 may be removed by a wet or a dry etching after formation of the V-shaped groove 401.

Figure 6:
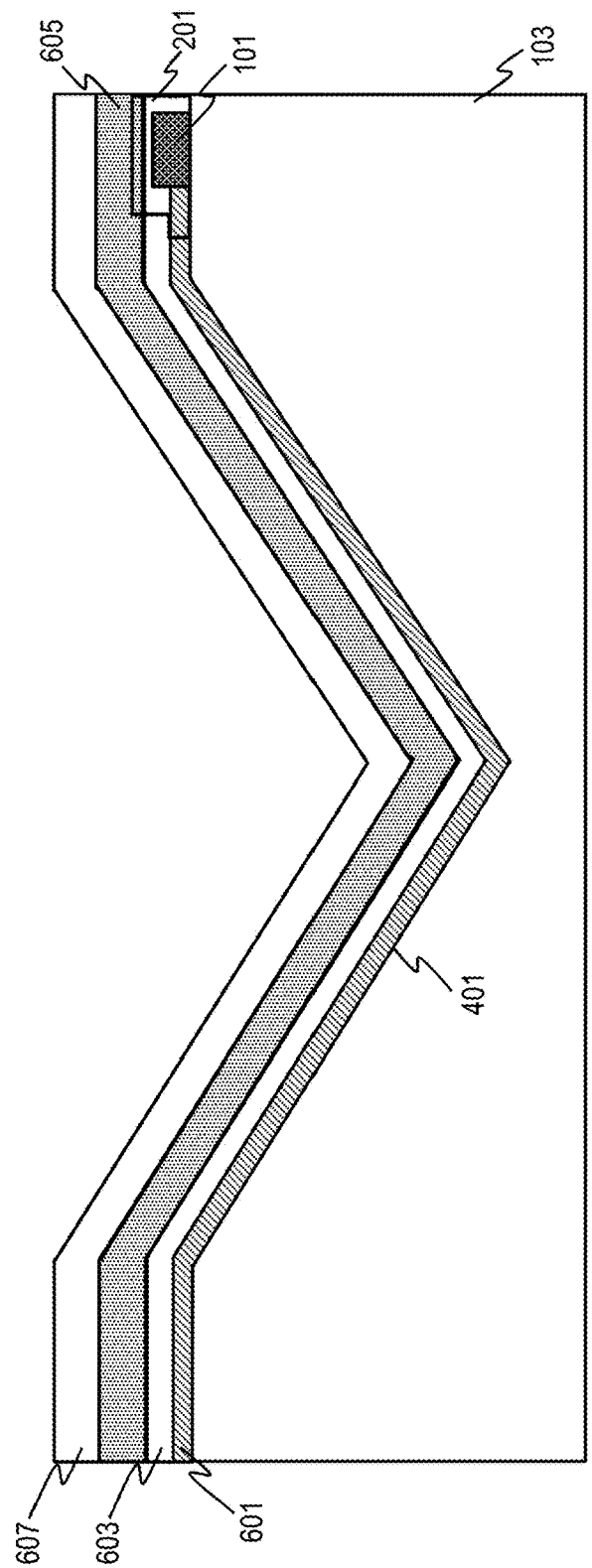

Referring to FIG. 6, a buffer layer 601 is formed, e.g., by a physical vapor deposition (PVD), a chemical vapor deposition (CVD), an atomic layer deposition (ALD), a plasma enhanced chemical vapor deposition (PECVD), or any other thin film deposition process known in the art, over portions of the Si substrate 103 and the V-shaped groove 401. Then, a GaN layer 603 is formed, e.g., to a thickness of 0.1 micrometer (μm) to 1 μm by PVD, CVD, ALD or PECVD, over the buffer layer 601 and a portion of the protective layer 201. Subsequently, an AlGaN layer 605 is formed, e.g., to a thickness of 0.01 μm to 0.5 μm by PVD, CVD, ALD or PECVD, over the GaN layer 603 and a portion of the protective layer 201. Next, a passivation layer 607 is formed, e.g., of aluminum nitride (AlN) or SiN to a thickness of 0.01 μm to 0.5 μm by PVD, CVD, ALD or PECVD, over the AlGaN layer 605. The layers 601, 603, and 605 are shown in a planar fashion over device 101 and protective layer 201. In actuality, they would step up over device 101 and protective layer 201 in a conformal fashion (not shown for illustrative convenience). The same applies to subsequent film depositions, such as layer 701 shown in FIG. 7.

Figure 7:
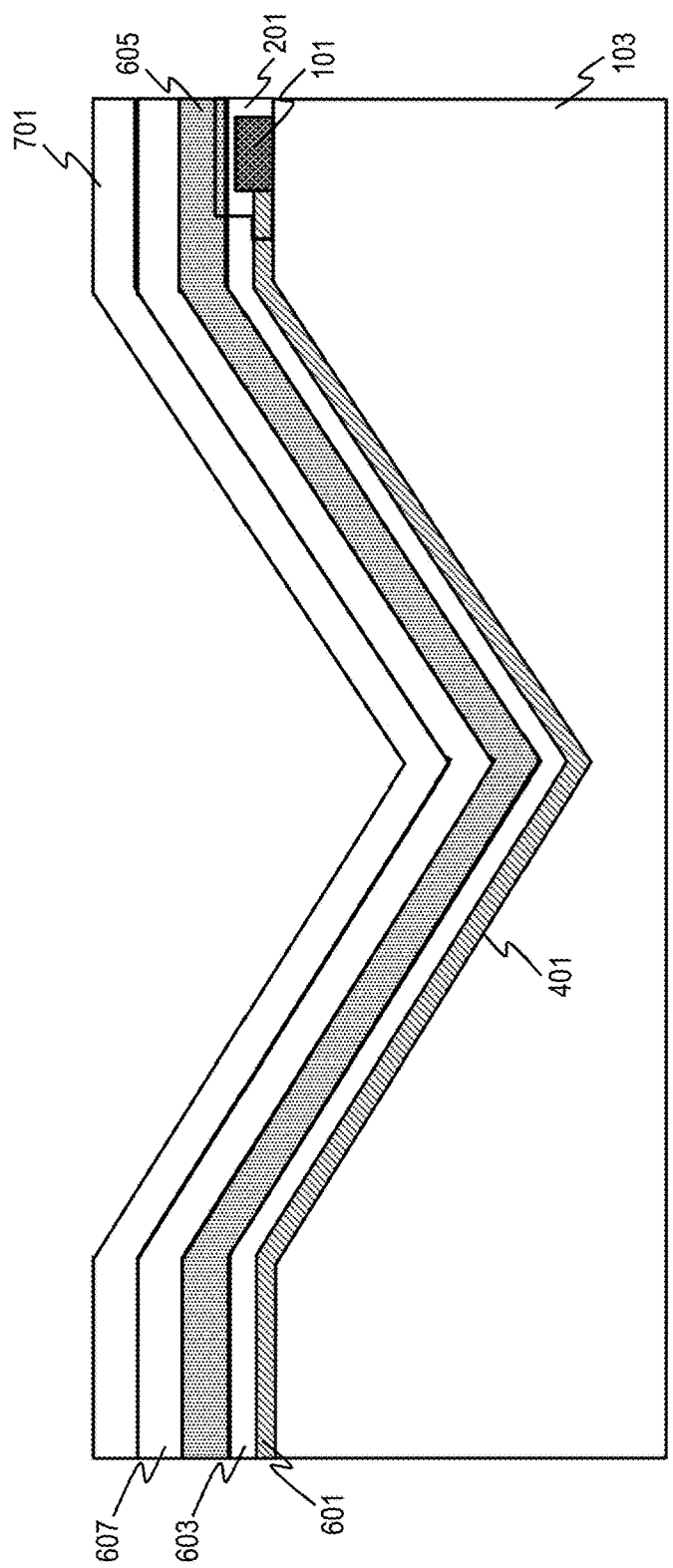
Figure 8:
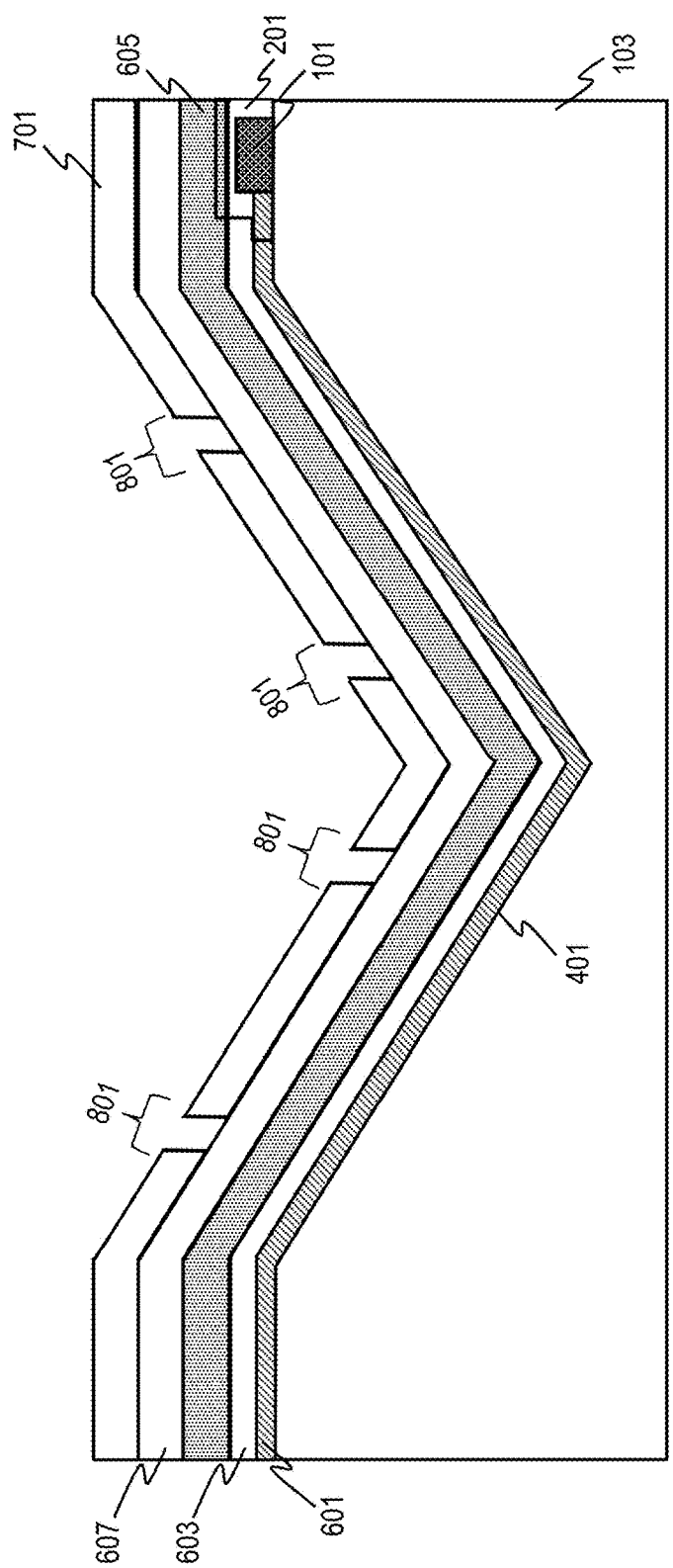
Figure 9:
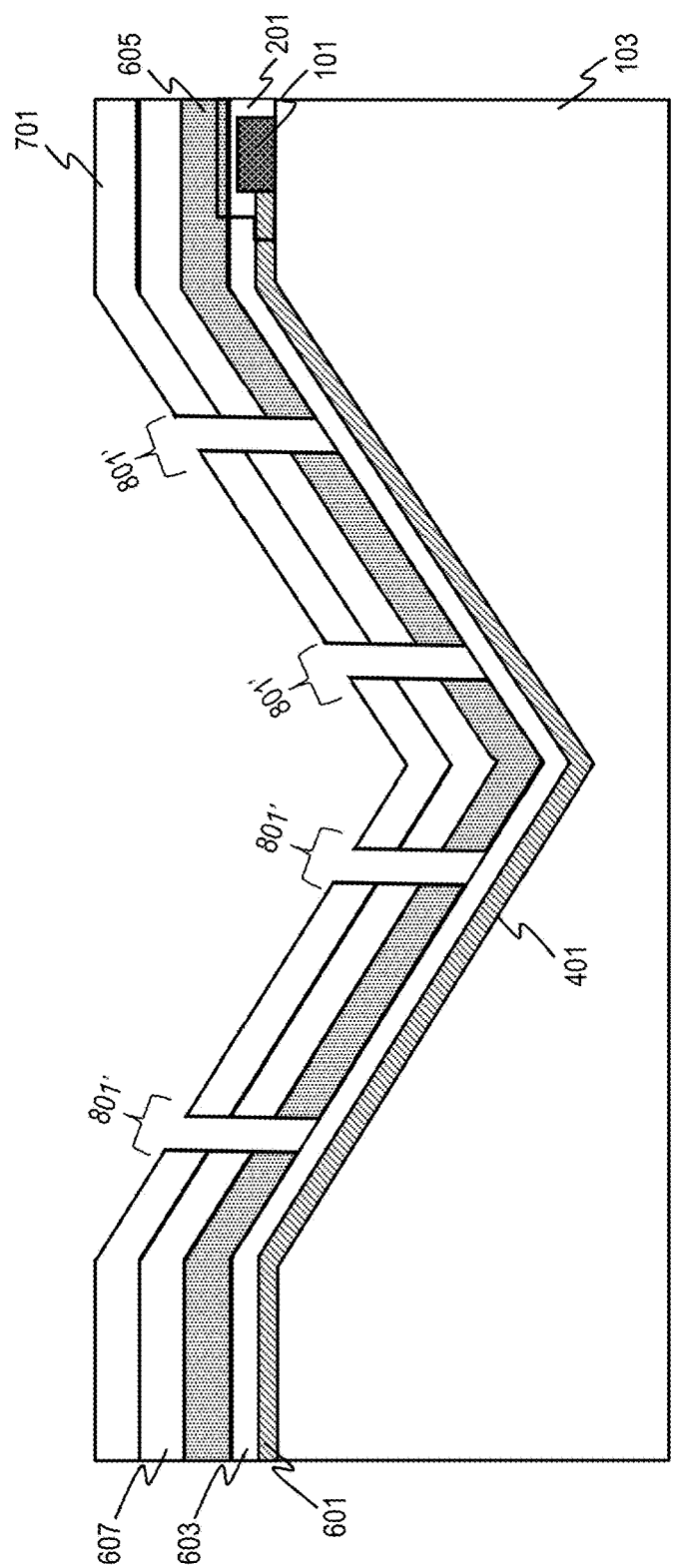

Referring to FIG. 7, a conformal or semi-conformal spin-on or dry resist layer 701 is formed, e.g., to a thickness of 0.3 μm to 10 μm by a standard spin-on process and a baking process or thin film resist deposition process, such as by using PECVD, over the passivation layer 607. Then, portions of the conformal or semi-conformal spin-on or dry resist layer 701 are patterned, e.g., by a low NA, a proximity lithography and the resist is developed, e.g., using tetramethylammonium hydroxide (TMAH) developer, down to the passivation layer 607, forming openings 801, as illustrated in FIG. 8. Next, the passivation layer 607 and the AlGaN layer 605 are etched, e.g., by a wet etching or a plasma etching with, e.g., $BCL_3/CL_2$ gases, through the openings 801 down to the GaN layer 603, forming openings 801', as depicted in FIG. 9. In one instance, the AlGaN layer 605 may be partially etched, whereupon the etching stops. In another instance, portions of the GaN layer 603 may be partially etched through the openings 801' to form contacts. The partial etching of the AlGaN layer 605 and the GaN layer 603 is based, at least in part, on the thermal budget and on-resistance requirements. In one instance, the openings 801 may be formed either on the one side or on the both sides of the V-shaped groove 401 depending on a resultant GaN metal-semiconductor field-effect transistor (MESFET) design, for example.

Figure 10:
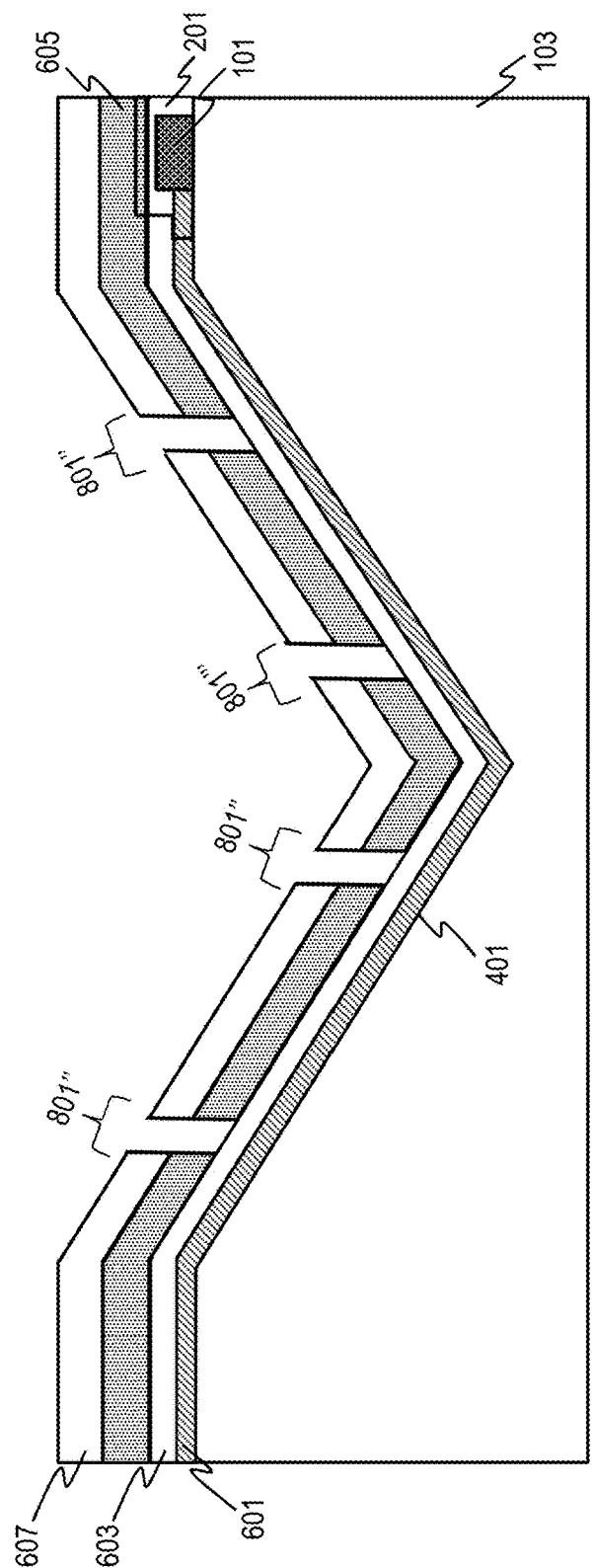
Figure 11:
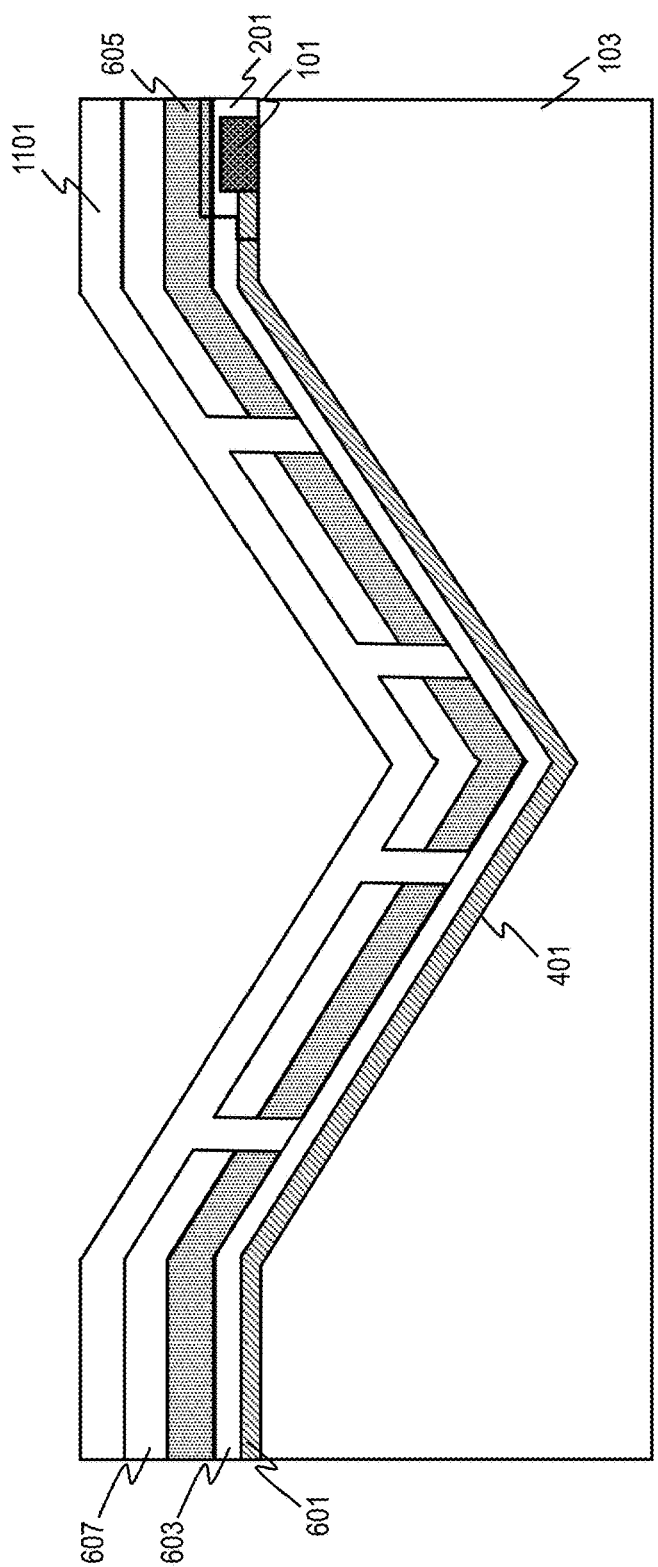
Figure 12:
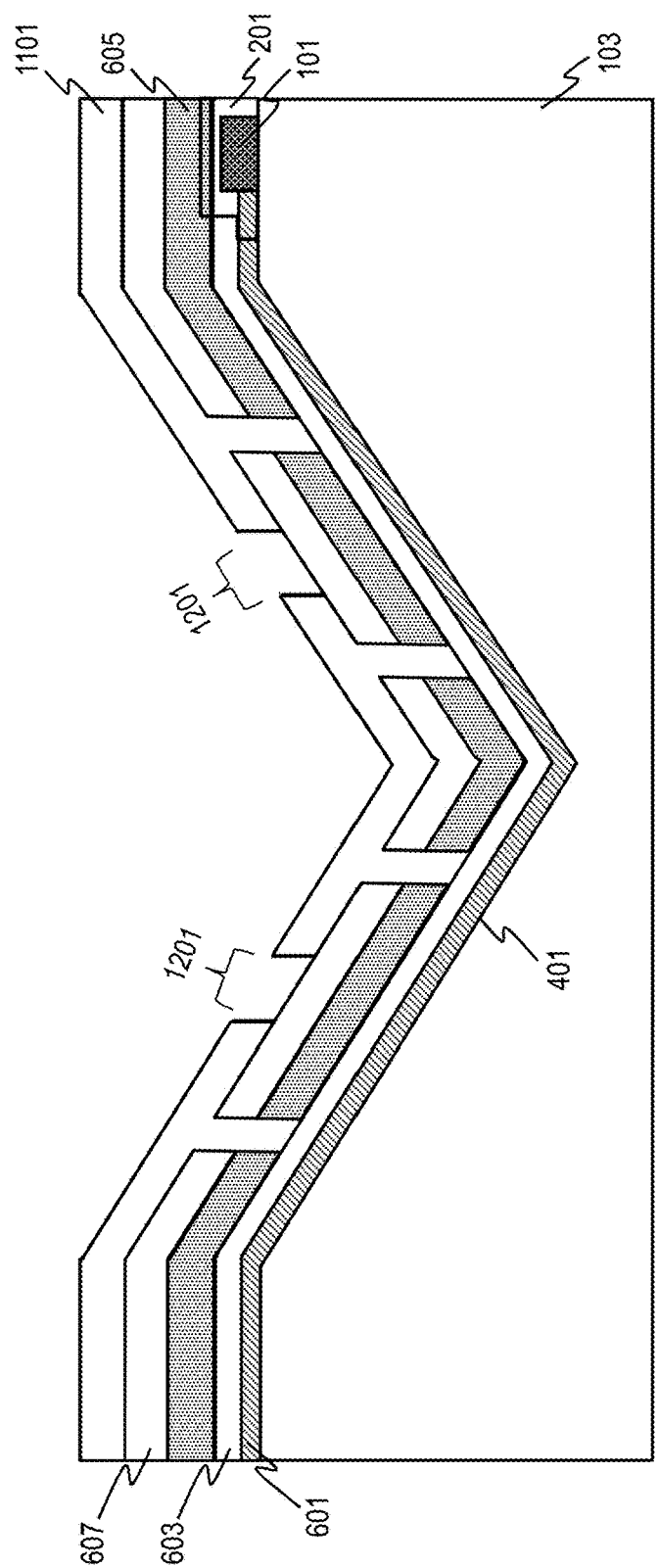
Figure 13:
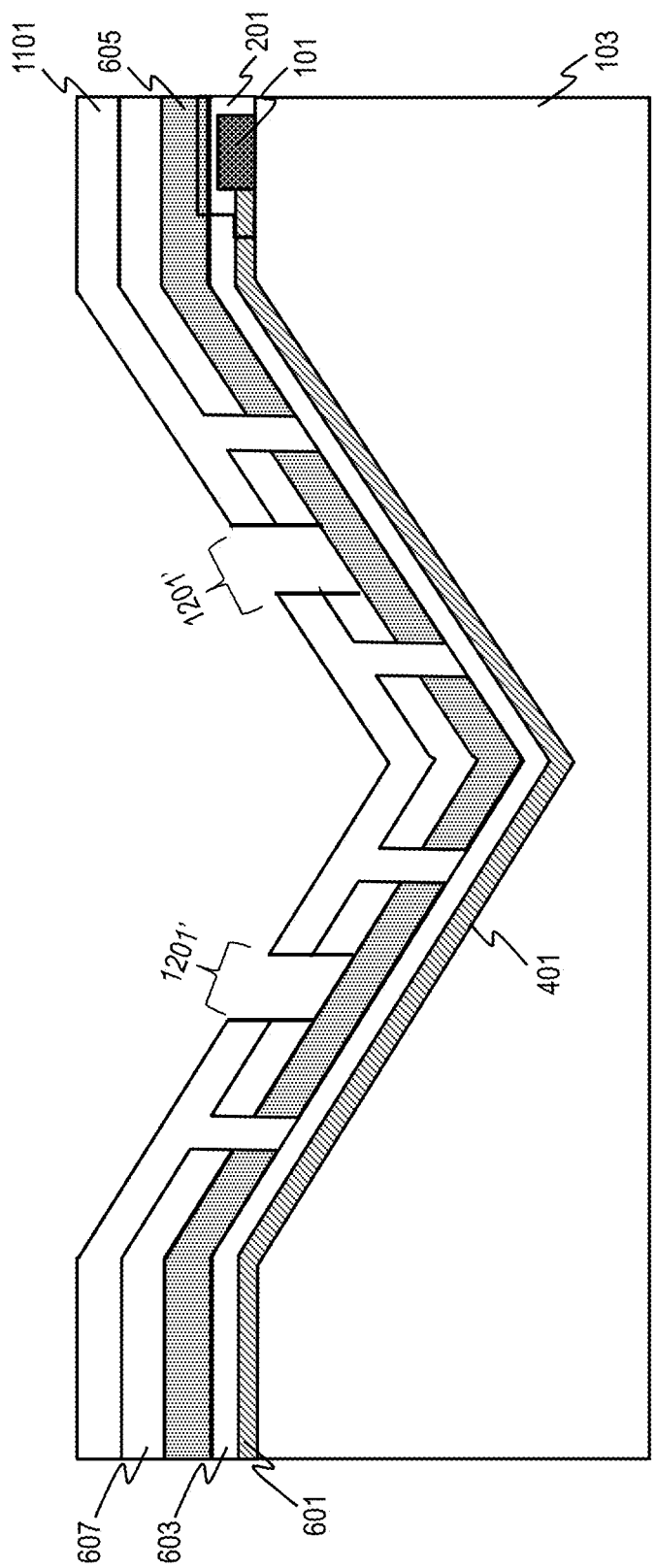
Figure 14:
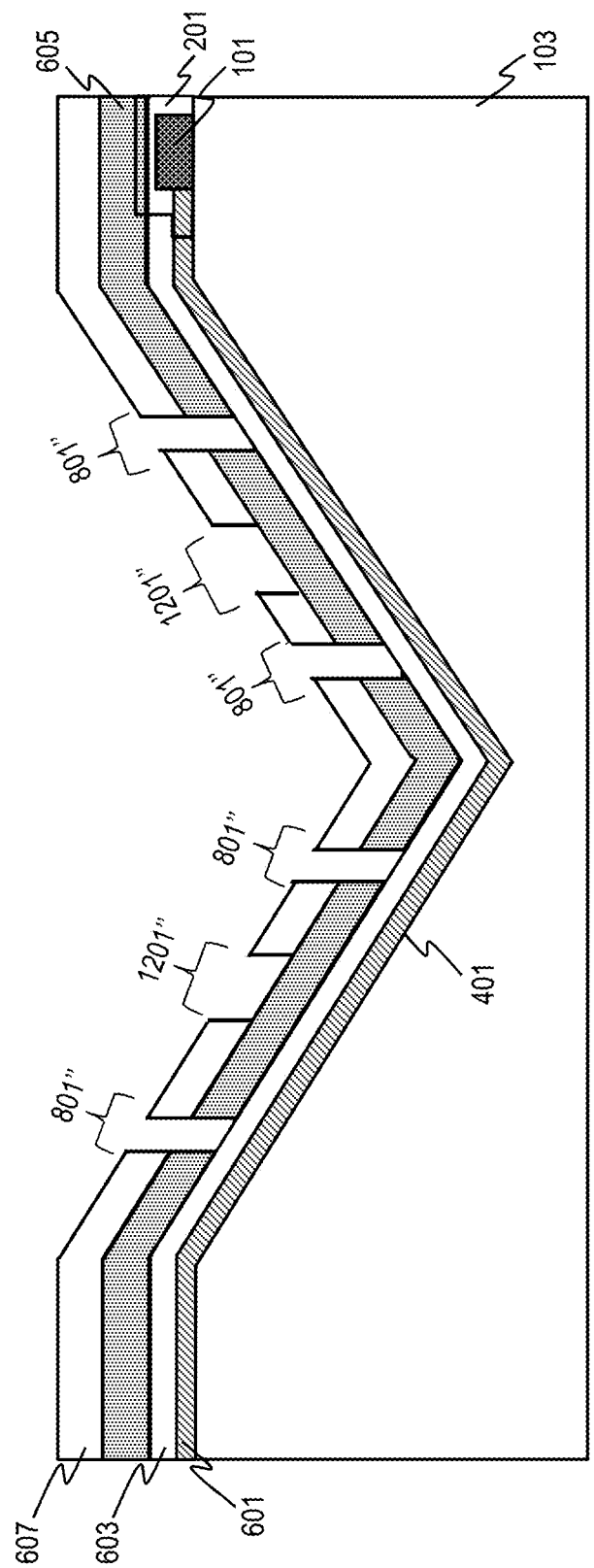

Subsequently, the conformal or semi-conformal spin-on or dry resist layer 701 is removed, e.g., by a stripping process, thereby forming openings 801", as depicted in FIG. 10. A resist layer 1101 is then conformally or semi-conformally formed, e.g., to a thickness of 0.3 μm to 10 μm by a standard spin-on process and a baking process or a dry resist deposition process, over the passivation layer 607 and filling the openings 801", as depicted in FIG. 11. Next, portions of the resist layer 1101 are patterned, e.g., by a low NA, a proximity lithography and developing using, e.g., TMAH, down to the passivation layer 607, forming openings 1201, as illustrated in FIG. 12. In one instance, the openings 1201 may be formed either on the one side or on the both sides of the V-shaped groove 401 depending on the resultant design and/or whether the openings 801 are formed on one side or both of the V-shaped groove 401. Referring to FIG. 13, the passivation layer 607 is etched, e.g., by a wet or a dry etching, through the openings 1201 down to the AlGaN layer 605, forming openings 1201'. In one instance, the AlGaN layer 605 may be partially etched, whereupon the etching stops. Subsequently, the resist layer 1101 is removed, e.g., by a stripping process, exposing openings 801" and forming openings 1201", as illustrated in FIG. 14.

Figure 15:
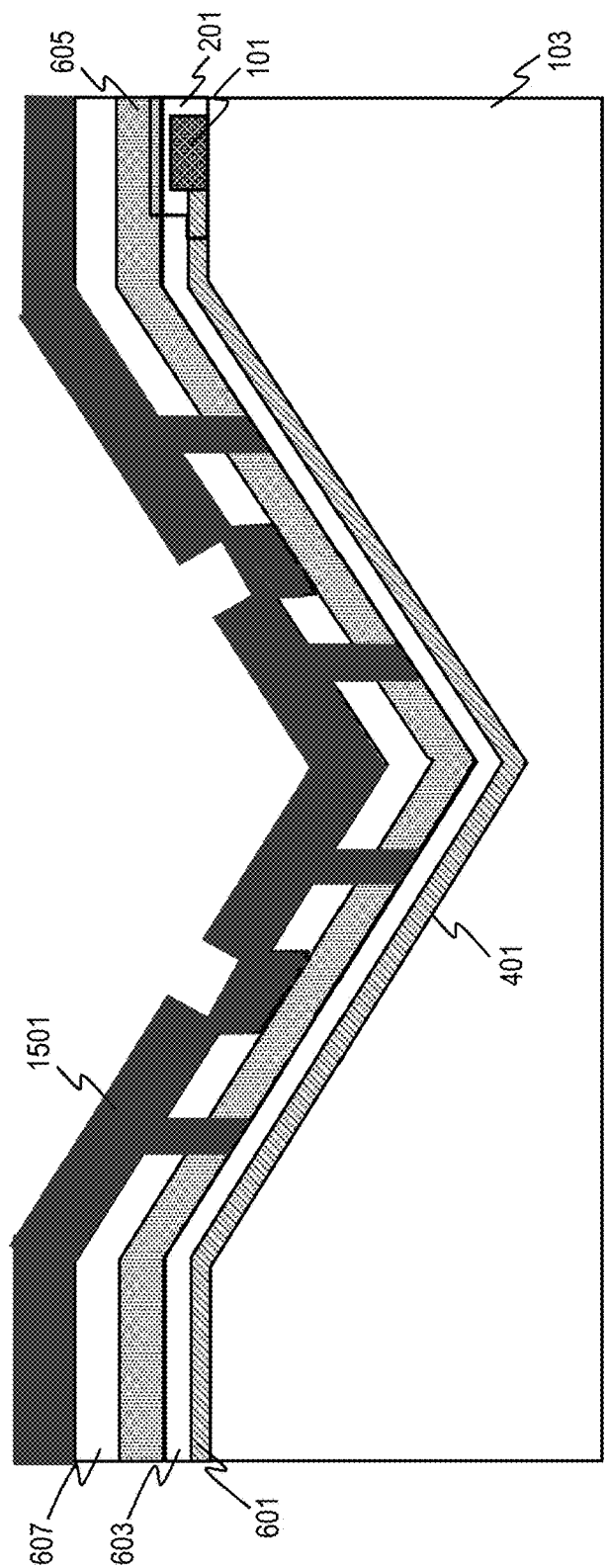
Figure 16:
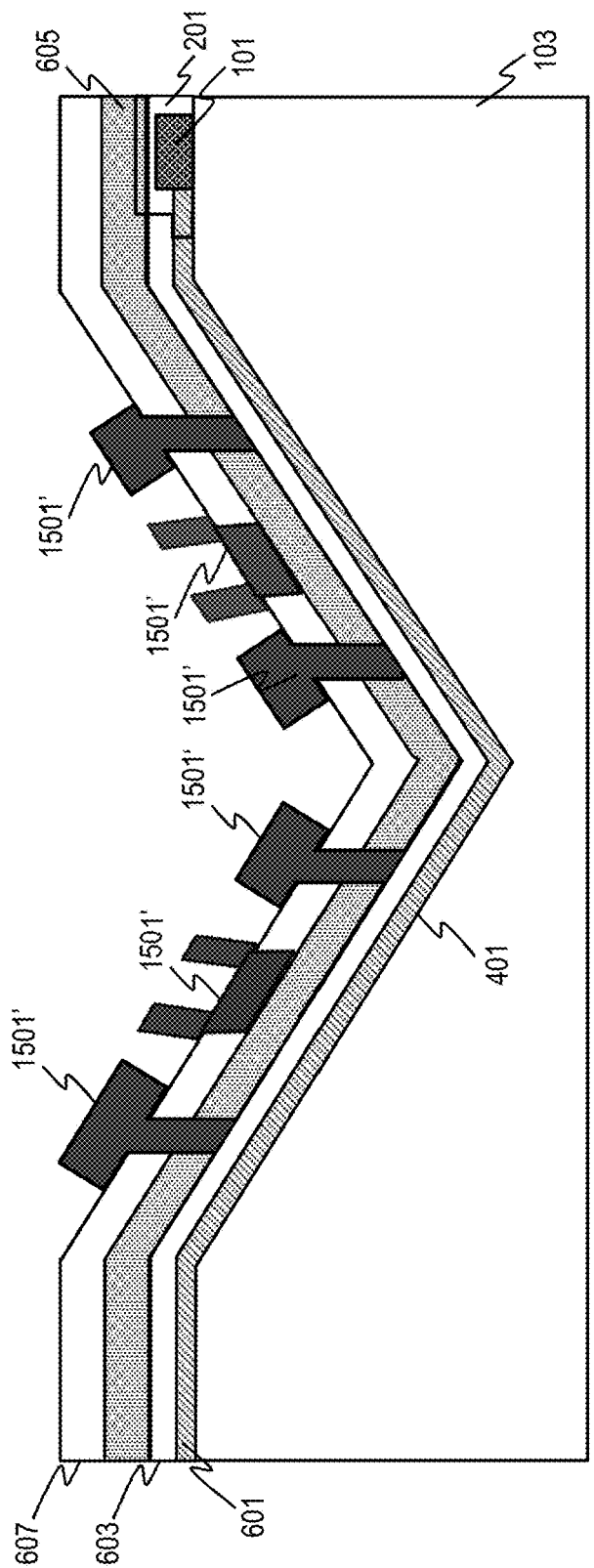
Figure 17:
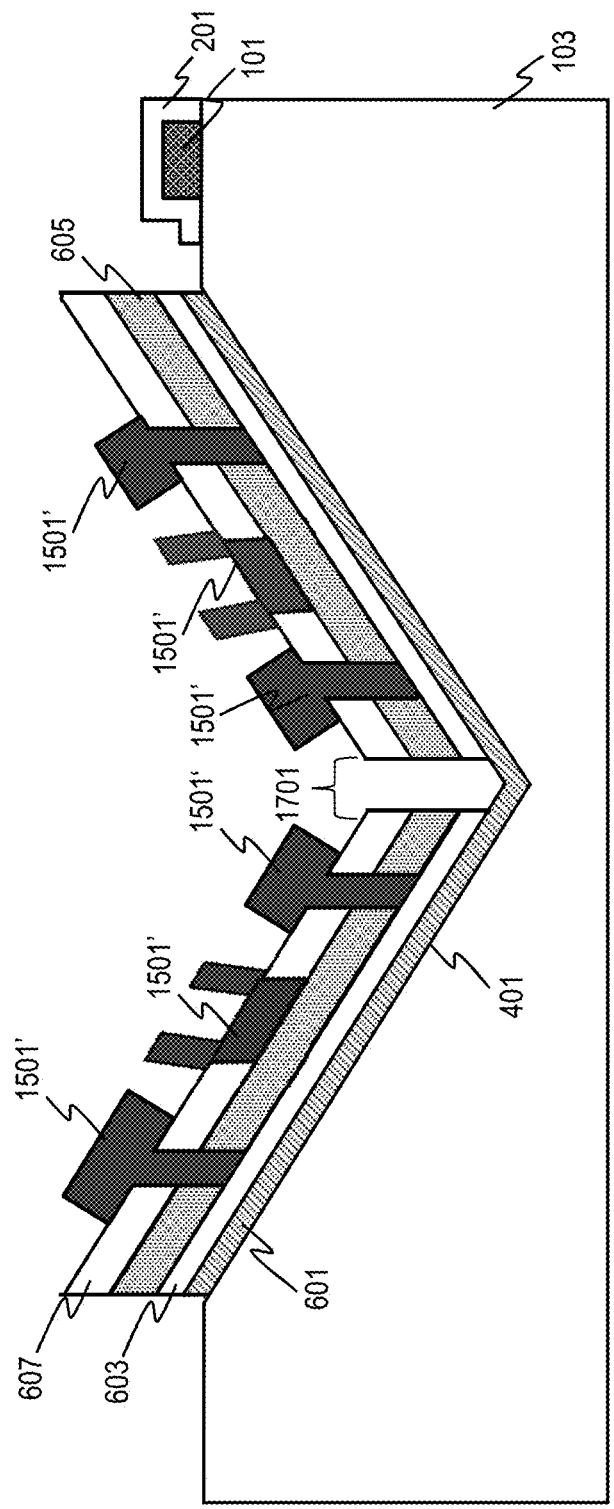

Referring to FIG. 15, an electrode layer 1501 is formed, e.g., of titanium nitride (TiN), molybdenum (Mo), or any other suitable conductor by CVD, ALD, PVD, or any other suitable deposition method, over the passivation layer 607 filling the openings 801" and 1201". Then, portions of the electrode layer are patterned using conformal photoresist and etched down to the passivation layer 607 and the photoresist is stripped, thereby forming electrode structures 1501', as shown in FIG. 16. In FIG. 17, a conformal resist layer (not shown for illustrative convenience) is formed over the passivation layer 607 and the electrode structures 1501'. Then, the conformal resist layer is patterned down to the passivation layer 607 outside of the V-shaped groove 401. Next, portions of the passivation layer 607, the AlGaN layer 605, the GaN layer 603 and the buffer layer 601 are etched down to the Si substrate 103 through the patterned conformal resist layer. It is contemplated that the portions of the passivation layer 607, the AlGaN layer 605 and the GaN layer 603 could also be etched down to the buffer layer 601. In this instance, the conformal resist layer is also patterned down to the passivation layer 607 in the center of the V-shaped groove 401 so that an isolation structure 1701 may be formed down to the buffer layer 601 or the Si substrate 103. Subsequently, the conformal resist layer is removed.

Figure 18:
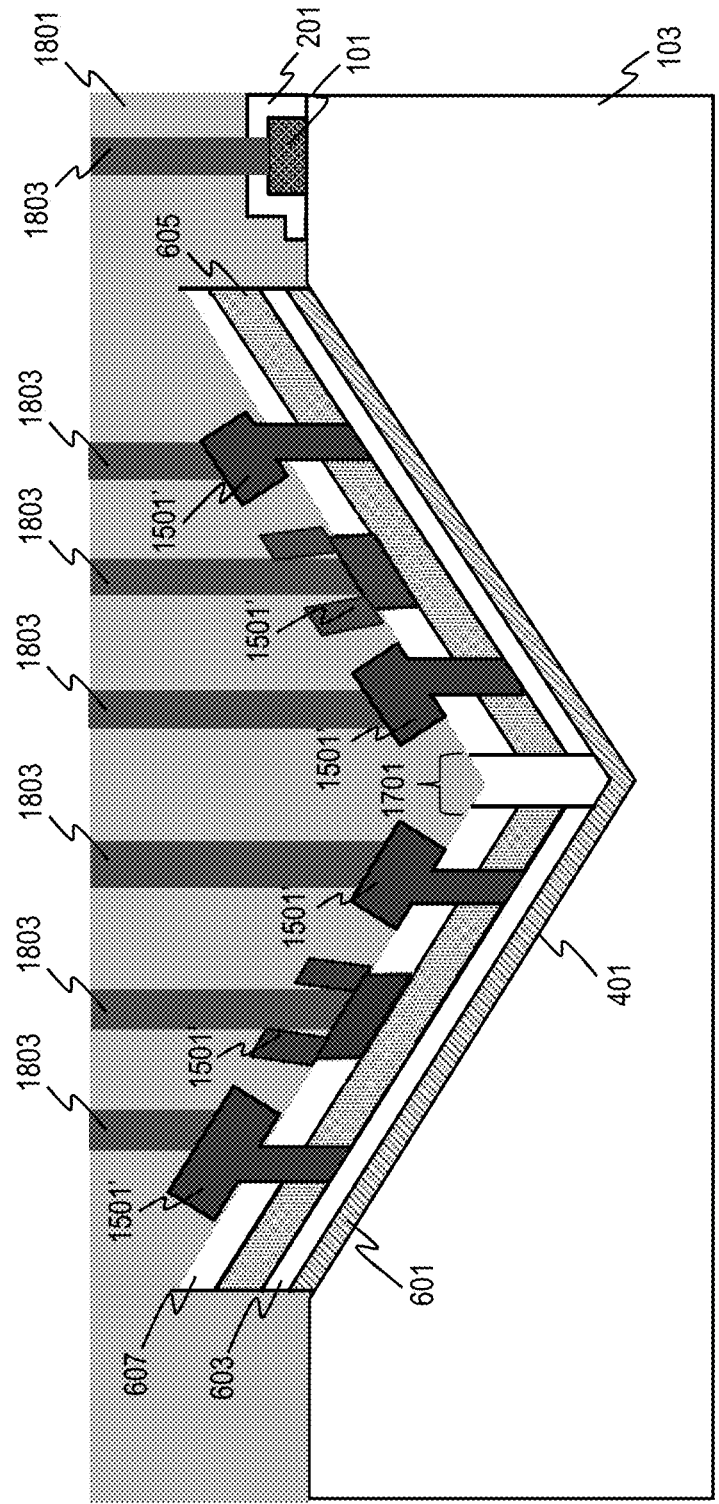

Referring to FIG. 18, a dielectric layer 1801 is formed over the Si substrate 103 and then planarized as known in the art, e.g., by CMP, etch-back, etc. Next, vias (not shown for illustrative convenience) are formed through the dielectric layer 1801 down to at least one of the electrode structure 1501' and through the protective layer 201 to the device 101. Subsequently, the vias are filled with a metal, e.g., Cu or W, forming metal-filled vias or wires 1803 as known in the art. It should be noted that another device could be formed prior to, during, or after the GaN PA structure formation. In that instance, the buffer layer 601 would be removed, e.g., patterned/etched, prior to formation of another device. Moreover, if other devices were formed before the GaN PA structure formation, then the passivation layer 607 could optionally be left over the devices or removed.

Figure 19:
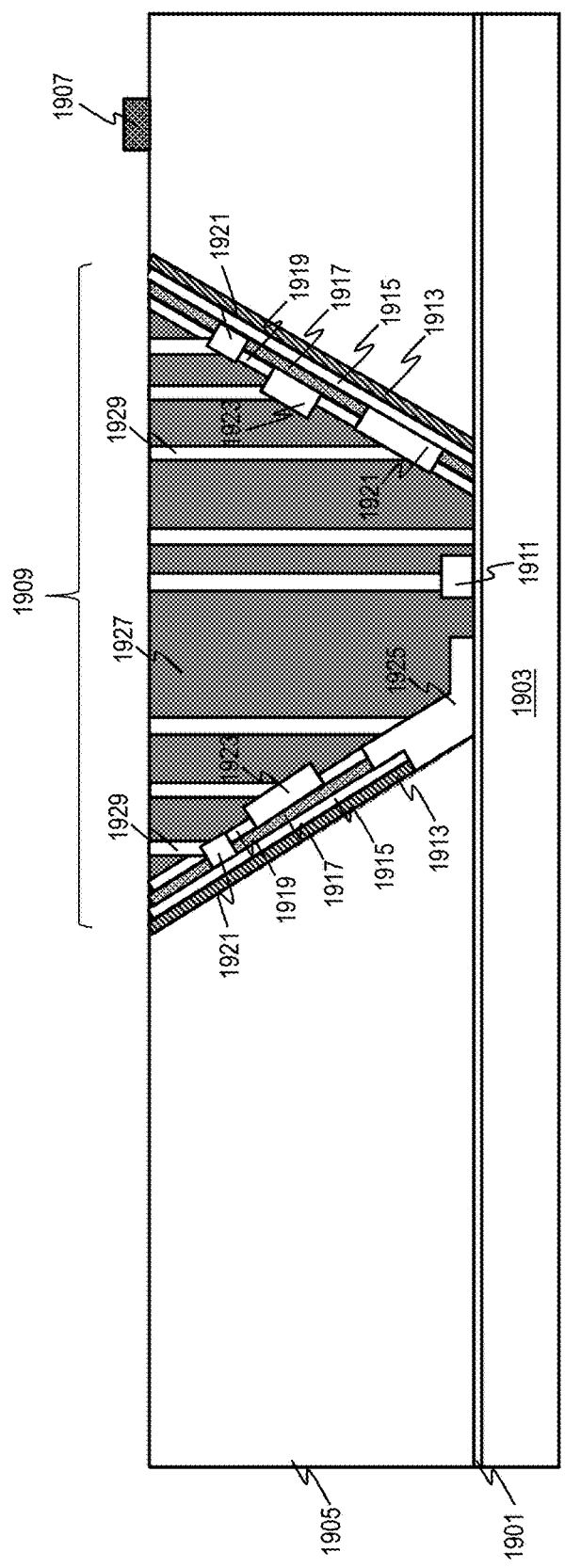
FIG. 19 is a cross-sectional view of a different embodiment of a CMOS device and a GaN PA structure formed on a 100 Si substrate having a 111 surface orientation with a SiGe stop layer, in accordance with another exemplary embodiment.

FIG. 19 is a cross-sectional view of a different embodiment of a CMOS device and a GaN PA structure formed on a 100 Si substrate having a 111 surface orientation with a SiGe stop layer, in accordance with another exemplary embodiment. Referring to FIG. 19, a SiGe layer 1901 is formed over a Si layer 1903 having a 100 Si orientation. In one instance, the SiGe layer 1901 acts as an etch stop layer. Next, a Si layer 1905 having a 100 Si orientation is formed over the SiGe layer 1901. Subsequently, a device 1907 similar to the device 101 of FIG. 1, e.g., a FET, a NPN transistor, a HBT, a MOS capacitor, a deep trench capacitor, a flash memory cell, a magnetic memory cell, a poly resistor, a diffusion resistor or a diode, is formed over a portion of a Si layer 1905. Thereafter, a trench 1909 having angled sidewalls is formed in a portion of the Si layer 1905 down to the SiGe layer 1901. In this instance, each sidewall of the trench 1909 has an angle of approximately 54.7 degrees with a 111 Si orientation. Subsequently, a device 1911 is formed over a portion of a SiGe layer 1901 within the trench 1909.

Next, following a similar process flow as described with respect to FIGS. 5 through 17, a buffer layer 1913 is formed over each angled sidewall of the trench 1909 and a GaN layer 1915, an AlGaN layer 1917, and a passivation layer 1919 are sequentially formed over the buffer layer 1913. The passivation layer 1919 may be formed, e.g., of AN or SiN to a thickness of 0.1 μm to 0.05 μm by PVD, CVD, ALD or PECVD. Electrode structures 1921 and 1923 are then formed through the passivation layer 1919 and the AlGaN layer 1917 down to the GaN layer 1915 and through the passivation layer 1919 down to the AlGaN layer 1917, respectively. At or about the same time, the electrode structure 1925 is formed through the passivation layer 1919 and the AlGaN layer 1917 down to the GaN layer 1915 and through the passivation layer 1919, the AlGaN layer 1917, the GaN layer 1915 and the buffer layer 1913 down to the Si layer 1905 and the SiGe layer 1901. Subsequently, a dielectric layer 1927 is formed over the Si layer 1905 filling the trench 1909, and metal-filled vias 1929 are formed through the dielectric layer 1927 down to each of the electrode structures 1921, 1923 and 1925, and the device 1911.

The embodiments of the present disclosure can achieve several technical effects, such as simultaneously using a 111 Si to make high quality GaN and a 100 Si to form CMOS devices. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including CMOS devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising: a complementary metal oxide semiconductor (CMOS) transistor on a 100 silicon (Si); and a gallium nitride (GaN) high electron mobility transistor (HEMT) on a 111 Si, wherein the 100 Si and the 111 Si are contiguous; wherein the GaN HEMT comprises: a buffer layer over a portion of each surface of a V-shaped groove; a gallium nitride (GaN) layer over the buffer layer; an aluminum gallium nitride (AlGaN) layer over the GaN layer; a passivation layer over the AlGaN layer; a first electrode over a portion of the passivation layer and through the passivation layer and the AlGaN layer down to the GaN layer; a second electrode over a portion of the passivation layer and through the passivation layer down to the AlGaN layer; a dielectric layer over the 111 Si; and a metal-filled via through the dielectric layer down to at least one of the first electrode and the second electrode.

2. The device according to claim 1, further comprising:
 a protective layer over the CMOS transistor and on portions of the 100 Si;
 a dielectric layer over the 100 Si and the protective layer; and
 the metal-filled via through the dielectric layer and the protective layer to the CMOS transistor.

3. The device according to claim 1, wherein the buffer layer, the GaN layer, the AlGaN layer, and the passivation layer each have vertical ends.

4. The device according to claim 1, wherein each sidewall of the V-shaped groove has an angle of approximately 54.7 degrees, and wherein each of the first electrode and the second electrode is formed at the angle of approximately 54.7 degrees.

5. The device according to claim 1, wherein each of the first electrode and the second electrode is formed on one sidewall of the V-shaped groove or both.

6. The device according to claim 1, further comprising:
 a second buffer layer over a remaining portion of the V-shaped groove.

7. The device according to claim 6, further comprising:
 a second GaN layer over the second buffer layer;
 a second AlGaN layer over the second GaN layer; and
 a second passivation layer over the second AlGaN layer.

8. A device comprising:
 a first silicon (Si) layer;
 a silicon germanium (SiGe) layer over the first Si layer;
 a second Si layer over the SiGe layer with a trench down to the SiGe layer having angled sidewalls;
 a buffer layer over a portion of each angled sidewall of the trench;
 a gallium nitride (GaN) layer over the buffer layer;
 an aluminum gallium nitride (AlGaN) layer over a portion of the GaN layer;
 a passivation layer over the AlGaN layer;
 a first electrode structure through the passivation layer and the AlGaN layer down to the GaN layer;
 a second electrode structure through the passivation layer down to the AlGaN layer;
 a third electrode structure through the passivation layer and the AlGaN layer down to the GaN layer and over a portion of one of the angled sidewall and the SiGe layer within the trench;
 a dielectric layer over the first Si layer, filling the trench;
 a device over a portion of the second Si layer proximate to the trench; and
 a metal-filled via through the dielectric layer down to each of the first electrode structure, the second electrode structure and the third electrode structure.

9. The device according to claim 8, further comprising:
 a second device formed over the SiGe layer within the trench; and
 a second metal-filled via through the dielectric layer down to the second device.

10. The device according to claim 8, wherein each angled sidewall comprises 111 Si and has an angle of approximately 54.7 degrees and wherein the first Si layer and a remaining portion of the second Si layer comprise 100 Si.

\* \* \* \* \*